(12) United States Patent
Feng et al.

(10) Patent No.: US 9,301,427 B2
(45) Date of Patent: Mar. 29, 2016

(54) HEAT-DISSIPATION STRUCTURE FOR AN INDICIA READING MODULE

(71) Applicant: Hand Held Products, Inc., Fort Mill, SC (US)

(72) Inventors: Chen Feng, Snohomish, WA (US); Tao Xian, Columbus, NJ (US); Edward C. Bremer, Victor, NY (US)

(73) Assignee: Hand Held Products, Inc., Fort Mill, SC (US)

( * ) Notice: Subject to any disclaimer, the term of this patent is extended or adjusted under 35 U.S.C. 154(b) by 7 days.

(21) Appl. No.: 14/276,301

(22) Filed: May 13, 2014

(65) Prior Publication Data

US 2015/0334870 A1    Nov. 19, 2015

(51) Int. Cl.
  *H05K 7/20*    (2006.01)
  *G06F 1/16*    (2006.01)
  *G06K 7/10*    (2006.01)

(52) U.S. Cl.
  CPC ............ *H05K 7/2039* (2013.01); *G06F 1/1696* (2013.01); *G06K 7/10732* (2013.01); *G06K 7/10811* (2013.01)

(58) Field of Classification Search
  CPC . H05K 7/2039; G06F 1/1696; G06F 7/10811; G06F 7/10732
  See application file for complete search history.

(56) References Cited

U.S. PATENT DOCUMENTS

| | | | |
|---|---|---|---|
| 6,832,725 B2 | 12/2004 | Gardiner et al. | |
| 7,128,266 B2 | 10/2006 | Zhu et al. | |
| 7,159,783 B2 | 1/2007 | Walczyk et al. | |
| 7,413,127 B2 | 8/2008 | Ehrhart et al. | |
| 7,726,575 B2 | 6/2010 | Wang et al. | |
| 8,294,969 B2 | 10/2012 | Plesko | |
| 8,317,105 B2 | 11/2012 | Kotlarsky et al. | |
| 8,322,622 B2 | 12/2012 | Liu | |
| 8,366,005 B2 | 2/2013 | Kotlarsky et al. | |
| 8,371,507 B2 | 2/2013 | Haggerty et al. | |
| 8,376,233 B2 | 2/2013 | Horn et al. | |
| 8,381,979 B2 | 2/2013 | Franz | |
| 8,390,909 B2 | 3/2013 | Plesko | |
| 8,408,464 B2 | 4/2013 | Zhu et al. | |
| 8,408,468 B2 | 4/2013 | Van Horn et al. | |
| 8,408,469 B2 | 4/2013 | Good | |
| 8,424,768 B2 | 4/2013 | Rueblinger et al. | |
| 8,448,863 B2 | 5/2013 | Xian et al. | |

(Continued)

FOREIGN PATENT DOCUMENTS

| WO | 2013163789 A1 | 11/2013 |
|---|---|---|
| WO | 2013173985 A1 | 11/2013 |
| WO | 2014019130 A1 | 2/2014 |

OTHER PUBLICATIONS

U.S. Appl. No. 13/367,978, filed Feb. 7, 2012, (Feng et al.); now abandoned.

(Continued)

*Primary Examiner* — Kristy A Haupt
(74) *Attorney, Agent, or Firm* — Additon, Higgins & Pendleton, P.A.

(57) ABSTRACT

Small mobile computing devices place stringent requirements on the electronic modules integrated within. High temperatures inside these mobile computing devices are unavoidable; therefore good thermal management is important to insure proper module operation. Here a heat-dissipation structure for an indicia-reading module integrated within a mobile computing device is disclosed.

8 Claims, 5 Drawing Sheets

(56) References Cited

U.S. PATENT DOCUMENTS

| | | |
|---|---|---|
| 8,457,013 B2 | 6/2013 | Essinger et al. |
| 8,459,557 B2 | 6/2013 | Havens et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,571,307 B2 | 10/2013 | Li et al. |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 2007/0063048 A1 | 3/2007 | Havens et al. |
| 2007/0108284 A1* | 5/2007 | Pankow et al. ............... 235/454 |
| 2008/0185432 A1 | 8/2008 | Caballero et al. |
| 2009/0134221 A1 | 5/2009 | Zhu et al. |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2011/0169999 A1 | 7/2011 | Grunow et al. |
| 2011/0202554 A1 | 8/2011 | Powilleit et al. |
| 2012/0111946 A1 | 5/2012 | Golant |
| 2012/0138685 A1 | 6/2012 | Qu et al. |
| 2012/0168511 A1 | 7/2012 | Kotlarsky et al. |
| 2012/0168512 A1 | 7/2012 | Kotlarsky et al. |
| 2012/0193407 A1 | 8/2012 | Barten |
| 2012/0193423 A1 | 8/2012 | Samek |
| 2012/0203647 A1 | 8/2012 | Smith |
| 2012/0223141 A1 | 9/2012 | Good et al. |
| 2012/0228382 A1 | 9/2012 | Havens et al. |
| 2012/0248188 A1 | 10/2012 | Kearney |
| 2013/0043312 A1 | 2/2013 | Van Horn |
| 2013/0056285 A1 | 3/2013 | Meagher |
| 2013/0070322 A1 | 3/2013 | Fritz et al. |
| 2013/0075168 A1 | 3/2013 | Amundsen et al. |
| 2013/0082104 A1 | 4/2013 | Kearney et al. |
| 2013/0175341 A1 | 7/2013 | Kearney et al. |
| 2013/0175343 A1 | 7/2013 | Good |
| 2013/0200158 A1 | 8/2013 | Feng et al. |
| 2013/0214048 A1 | 8/2013 | Wilz |
| 2013/0256418 A1 | 10/2013 | Havens et al. |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0278425 A1 | 10/2013 | Cunningham et al. |
| 2013/0287258 A1 | 10/2013 | Kearney |
| 2013/0292474 A1 | 11/2013 | Xian et al. |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306730 A1 | 11/2013 | Brady et al. |
| 2013/0306731 A1 | 11/2013 | Pedraro |
| 2013/0306734 A1 | 11/2013 | Xian et al. |
| 2013/0307964 A1 | 11/2013 | Bremer et al. |
| 2013/0308625 A1 | 11/2013 | Corcoran |
| 2013/0313324 A1 | 11/2013 | Koziol et al. |
| 2013/0313325 A1 | 11/2013 | Wilz et al. |
| 2013/0313326 A1 | 11/2013 | Ehrhart |
| 2013/0327834 A1 | 12/2013 | Hennick et al. |
| 2013/0341399 A1 | 12/2013 | Xian et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008430 A1 | 1/2014 | Soule et al. |
| 2014/0008439 A1 | 1/2014 | Wang |
| 2014/0021256 A1 | 1/2014 | Qu et al. |
| 2014/0025584 A1 | 1/2014 | Liu et al. |
| 2014/0027518 A1 | 1/2014 | Edmonds et al. |
| 2014/0034723 A1 | 2/2014 | Van Horn et al. |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061305 A1 | 3/2014 | Nahill et al. |
| 2014/0061306 A1 | 3/2014 | Wu et al. |
| 2014/0061307 A1 | 3/2014 | Wang et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0075846 A1 | 3/2014 | Woodburn |
| 2014/0076974 A1 | 3/2014 | Havens et al. |

(56) References Cited

U.S. PATENT DOCUMENTS

| | | | |
|---|---|---|---|
| 2014/0078341 | A1 | 3/2014 | Havens et al. |
| 2014/0078342 | A1 | 3/2014 | Li et al. |
| 2014/0078345 | A1 | 3/2014 | Showering |
| 2014/0084068 | A1 | 3/2014 | Gillet et al. |
| 2014/0086348 | A1 | 3/2014 | Peake et al. |
| 2014/0097249 | A1 | 4/2014 | Gomez et al. |
| 2014/0098284 | A1 | 4/2014 | Oberpriller et al. |
| 2014/0098792 | A1 | 4/2014 | Wang et al. |
| 2014/0100774 | A1 | 4/2014 | Showering |
| 2014/0100813 | A1 | 4/2014 | Showering |
| 2014/0103115 | A1 | 4/2014 | Meier et al. |
| 2014/0104413 | A1 | 4/2014 | McCloskey et al. |
| 2014/0104414 | A1 | 4/2014 | McCloskey et al. |
| 2014/0104416 | A1 | 4/2014 | Giordano et al. |
| 2014/0104451 | A1 | 4/2014 | Todeschini et al. |
| 2014/0106594 | A1 | 4/2014 | Skvoretz |
| 2014/0106725 | A1 | 4/2014 | Sauerwein |
| 2014/0108010 | A1 | 4/2014 | Maltseff et al. |
| 2014/0108402 | A1 | 4/2014 | Gomez et al. |
| 2014/0108682 | A1 | 4/2014 | Caballero |
| 2014/0110485 | A1 | 4/2014 | Toa et al. |
| 2014/0114530 | A1 | 4/2014 | Fitch et al. |
| 2014/0121438 | A1 | 5/2014 | Kearney |
| 2014/0121445 | A1 | 5/2014 | Ding et al. |
| 2014/0124577 | A1 | 5/2014 | Wang et al. |
| 2014/0124579 | A1 | 5/2014 | Ding |
| 2014/0125842 | A1 | 5/2014 | Winegar |
| 2014/0125853 | A1 | 5/2014 | Wang |
| 2014/0125999 | A1 | 5/2014 | Longacre et al. |
| 2014/0129378 | A1 | 5/2014 | Richardson |
| 2014/0131441 | A1 | 5/2014 | Nahill et al. |
| 2014/0133379 | A1 | 5/2014 | Wang et al. |
| 2014/0140585 | A1 | 5/2014 | Wang |
| 2014/0151453 | A1 | 6/2014 | Meier et al. |
| 2014/0160329 | A1 | 6/2014 | Ren et al. |

OTHER PUBLICATIONS

U.S. Appl. No. 13/736,139 for an Electronic Device Enclosure, filed Jan. 8, 2013 (Chaney); 40 pages.

U.S. Appl. No. 13/771,508 for an Optical Redirection Adapter, filed Feb. 20, 2013 (Anderson); 26 pages.

U.S. Appl. No. 13/780,356 for a Mobile Device Having Object Identification Interface, filed Feb. 28, 2013 (Samek et al.); 21 pages.

U.S. Appl. No. 13/852,097 for a System and Method for Capturing and Preserving Vehicle Event Data, filed Mar. 28, 2013 (Barker et al.); 20 pages.

U.S. Appl. No. 13/902,110 for a System and Method for Display of Information Using a Vehicle-Mount Computer, filed May 24, 2013 (Hollifield); 29 pages.

U.S. Appl. No. 13/902,144, for a System and Method for Display of Information Using a Vehicle-Mount Computer, filed May 24, 2013 (Chamberlin); 23 pages.

U.S. Patent Application No. 13/902,242 for a System for Providing a Continuous Communication Link With a Symbol Reading Device, filed May 24, 2013 (Smith et al.); 24 pages.

U.S. Appl. No. 13/912,262 for a Method of Error Correction for 3D Imaging Device, filed Jun. 7, 2013 (Jovanovski et al.); 33 pages.

U.S. Appl. No. 13/912,702 for a System and Method for Reading Code Symbols at Long Range Using Source Power Control, filed Jun. 7, 2013 (Xian et al.); 24 pages.

U.S. Appl. No. 13/922,339 for a System and Method for Reading Code Symbols Using a Variable Field of View, filed Jun. 20, 2013 (Xian et al.); 23 pages.

U.S. Appl. No. 13/927,398 for a Code Symbol Reading System Having Adaptive Autofocus, filed Jun. 26, 2013 (Todeschini); 24 pages.

U.S. Appl. No. 13/930,913 for a Mobile Device Having an Improved User Interface for Reading Code Symbols, filed Jun. 28, 2013 (Gelay et al.); 24 pages.

U.S. Appl. No. 13/933,415 for an Electronic Device Case, filed Jul. 2, 2013 (London et al.); 47 pages.

U.S. Appl. No. 13/947,296 for a System and Method for Selectively Reading Code Symbols, filed Jul. 22, 2013 (Rueblinger et al.); 29 pages.

U.S. Appl. No. 13/950,544 for a Code Symbol Reading System Having Adjustable Object Detection, filed Jul. 25, 2013 (Jiang); 28 pages.

U.S. Appl. No. 13/961,408 for a Method for Manufacturing Laser Scanners, filed Aug. 7, 2013 (Saber et al.); 26 pages.

U.S. Appl. No. 14/018,729 for a Method for Operating a Laser Scanner, filed Sep. 5, 2013 (Feng et al.); 24 pages.

U.S. Appl. No. 14/019,616 for a Device Having Light Source to Reduce Surface Pathogens, filed Sep. 6, 2013 (Todeschini); 23 pages.

U.S. Appl. No. 14/023,762 for a Handheld Indicia Reader Having Locking Endcap, filed Sep. 11, 2013 (Gannon); 31 pages.

U.S. Appl. No. 14/035,474 for Augmented-Reality Signature Capture, filed Sep. 24, 2013 (Todeschini); 33 pages.

U.S. Appl. No. 14/047,896 for Terminal Having Illumination and Exposure Control filed Oct. 7, 2013 (Jovanovski et al.); 32 pages.

U.S. Appl. No. 14/053,175 for Imaging Apparatus Having Imaging Assembly, filed Oct. 14, 2013 (Barber); 39 pages.

U.S. Appl. No. 14/055,234 for Dimensioning System, filed Oct. 16, 2013 (Fletcher); 26 pages.

U.S. Appl. No. 14/053,314 for Indicia Reader, filed Oct. 14, 2013 (Huck); 29 pages.

U.S. Appl. No. 14/065,768 for Hybrid System and Method for Reading Indicia, filed Oct. 29, 2013 (Meier et al.); 22 pages.

U.S. Appl. No. 14/074,746 for Self-Checkout Shopping System, filed Nov. 8, 2013 (Hejl et al.); 26 pages.

U.S. Appl. No. 14/074,787 for Method and System for Configuring Mobile Devices via NFC Technology, filed Nov. 8, 2013 (Smith et al.); 28 pages.

U.S. Appl. No. 14/087,190 for Optimal Range Indicators for Bar Code Validation, filed Nov. 22, 2013 (Hejl); 27 pages.

U.S. Appl. No. 14/345,735 for Optical Indicia Reading Terminal with Combined Illumination filed Mar. 19, 2014 (Ouyang); 19 pages.

U.S. Appl. No. 14/101,965 for High Dynamic-Range Indicia Reading System, filed Dec. 10, 2013 (Xian); 28 pages.

U.S. Appl. No. 14/118,400 for Indicia Decoding Device with Security Lock, filed Nov. 18, 2013 (Liu); 28 pages.

U.S. Appl. No. 14/150,393 for Incicia-reader Having Unitary Construction Scanner, filed Jan. 8, 2014 (Colavito et al.); 28 pages.

U.S. Appl. No. 14/154,207 for Laser Barcode Scanner, filed Jan. 14, 2014 (Hou et al.); 26 pages.

U.S. Appl. No. 14/154,915 for Laser Scanning Module Employing a Laser Scanning Assembly having Elastomeric Wheel Hinges, filed Jan. 14, 2014 (Havens et al.); 24 pages.

U.S. Appl. No. 14/158,126 for Methods and Apparatus to Change a Feature Set on Data Collection Devices, filed Jan. 17, 2014 (Berthiaume et al.); 53 pages.

U.S. Appl. No. 14/342,551 for Terminal Having Image Data Format Conversion filed Mar. 4, 2014 (Lui et al.); 25 pages.

U.S. Appl. No. 14/342,544 for Imaging Based Barcode Scanner Engine with Multiple Elements Supported on a Common Printed Circuit Board filed Mar. 4, 2014 (Liu et al.); 27 pages.

U.S. Appl. No. 14/257,174 for Reading Apparatus Having Partial Frame Operating Mode filed Apr. 21, 2014, (Barber et al.), 67 pages.

U.S. Appl. No. 14/200,405 for Indicia Reader for Size-Limited Applications filed Mar. 7, 2014 (Feng et al.); 42 pages.

U.S. Appl. No. 14/166,103 for Indicia Reading Terminal Including Optical Filter filed Jan. 28, 2014 (Lu et al.); 29 pages.

U.S. Appl. No. 14/274,858 for Mobile Printer With Optional Battery Accessory, filed May 12, 2014, (Marty et al), 26 pages.

U.S. Appl. No. 14/264,173 for Autofocus Lens System for Indicia Readers filed Apr. 29, 2014, (Ackley et al.), 39 pages.

U.S. Appl. No. 14/230,322 for Focus Module and Components with Actuator filed Mar. 31, 2014 (Feng et al.); 92 pages.

U.S. Appl. No. 14/222,994 for Method and Apparatus for Reading Optical Indicia Using a Plurality of Data filed Mar. 24, 2014 (Smith et al.); 30 pages.

(56) References Cited

OTHER PUBLICATIONS

U.S. Appl. No. 14/231,898 for Hand-Mounted Indicia-Reading Device with Finger Motion Triggering filed Apr. 1, 2014 (Van Horn et al.); 36 pages.
U.S. Appl. No. 29/486,759 for an Imaging Terminal, filed Apr. 2, 2014 (Oberpriller et al.); 8 pages.
U.S. Appl. No. 29/436,337 for an Electronic Device, filed Nov. 5, 2012 (Fitch et al.); 19 pages.
U.S. Appl. No. 29/458,405 for an Electronic Device, filed Jun. 19, 2013 (Fitch et al.); 22 pages.
U.S. Appl. No. 29/459,620 for an Electronic Device Enclosure, filed Jul. 2, 2013 (London et al.); 21 pages.
U.S. Appl. No. 29/459,681 for an Electronic Device Enclosure, filed Jul. 2, 2013 (Chaney et al.); 14 pages.
U.S. Appl. No. 29/459,785 for a Scanner and Charging Base, filed Jul. 3, 2013 (Fitch et al.); 21 pages.
U.S. Appl. No. 29/459,823 for a Scanner, filed Jul. 3, 2013 (Zhou et al.); 13 pages.
U.S. Appl. No. 29/468,118 for an Electronic Device Case, filed Sep. 26, 2013 (Oberpriller et al.); 44 pages.

\* cited by examiner

HEAT-DISSIPATION STRUCTURE FOR AN INDICIA READING MODULE

FIELD OF THE INVENTION

The present invention relates to the field of indicia readers and, more specifically, to a heat-dissipation structure for an indicia-reading module integrated within a mobile computing device.

BACKGROUND

Over the past forty years, businesses have sought to maximize efficiency by using various devices to automate data entry. In the important area of inventory management, in particular, the indicia-reading device (e.g., barcode reader or barcode scanner) has greatly reduced the time and errors inherent to manual data entry.

Indicia-reading devices are often employed to decode barcodes. A barcode is a machine-readable representation of information in graphic format. Traditionally, a barcode is a series of parallel bars and spaces of varying widths (e.g., a linear barcode or 1D barcode). More recently, there has been an increase in the use of alternatives to the linear barcode. For example, matrix codes (e.g., 2D barcodes or QR Code) and Optical Character Recognition (i.e., OCR) have enjoyed increasing popularity as the technology advances. As used herein, the terms barcode, indicia, and code-symbol are intended in their broadest sense to include linear barcodes, matrix barcodes, and OCR-enabled labels.

Indicia readers (e.g., barcode readers) tend to fall into one of three categories: wand readers, laser-scan-engine readers, and image-sensor readers. Wand readers generally include a single light source and single photodetector housed in a pen shaped housing. A user drags the wand reader across a barcode and a signal is generated representative of the bar-space pattern of the barcode.

Laser-scan-engine readers typically include a laser diode for generating a light beam and a moving mirror for sweeping the light beam across a code symbol. A signal from the reflected light corresponds to the barcode.

Image-sensor readers include a multi-element image sensor, such as a complementary-metal-oxide semiconductor (i.e., CMOS) image sensor, for generating an electronic signal representing an image formed on the image sensor. These readers include an imaging optic for focusing an image onto the image sensor. Image-sensor readers capture a digital picture of a target (e.g., barcode) and use software algorithms running on a processor to find and decode the symbol into useful information. Image-sensor readers offer more features than other types of readers. These features result from the versatility of the image processing algorithms. The limits of these algorithms are based on the processing resources available from the device.

Virtually all thin-profile, hand-held, mobile computing devices now have integrated cameras. As a result, applications capable of utilizing the integrated camera as an image sensor for indicia reading have been developed. While these applications perform reasonably well for the casual user, they lack the features and functions present in a dedicated image-sensor reader. Illumination, aiming, stabilization, and focusing could all suffer when using the integrated camera for indicia reading.

Carrying a single mobile computing device is desirable to most users. These users will be reluctant to trade their mobile computing device (i.e., MCD) for a dedicated indicia-reading device. Fortunately, an indicia-reading module, with all of the features of a dedicated indicia-reading device, can be integrated with an MCD without being bulky. Such a module must be small to allow for seamless integration with the MCD. The module must integrate with the MCD in such a way as to allow for imaging. These integration requirements place severe limitations on the design of the indicia-reading module. Unique design approaches and construction methods must be combined to facilitate the consequences of the integration within the body of a slim MCD.

The image sensor used in an indicia-reading module is especially sensitive to temperature, and its performance quickly degrades as the module temperature rises. High temperatures within an MCD are unavoidable. Thermal management, therefore, is an important design consideration for an indicia-reading module that is to be integrated within an MCD. The indicia-reading module must dissipate heat in spite of its small volume and surface area and do so in a space where heat transfer through convection are greatly limited. A need, therefore, exists for a conductive module heat-dissipation structure to insure module temperatures for proper operation.

SUMMARY

Accordingly, in one aspect, the present invention embraces an indicia-reading module integrated within a body of a MCD in such a way as to facilitate the imaging of indicia. The indicia-reading module includes a sensor subassembly with an adjustable lens for imaging the indicia-reading module's field of view onto a sensor integrated circuit (i.e., IC), the sensor IC having a plurality of pixels for detecting the image. The indicia-reading module also includes an illuminator-aimer subassembly for (i) projecting light onto a target within the indicia-reading module's field of view and (ii) projecting a visible aligning pattern onto the target. The visible aligning pattern corresponds with the indicia-reading module's field of view and helps an operator align the indicia-reading module with the target. In addition, the indicia-reading module includes a processing subassembly with a processor IC for executing image-processing algorithms. These algorithms can be configured to recognize and decode symbols (e.g., indicia). An interface subassembly is also included for facilitating communication between the indicia-reading module and a host device. The subassemblies are supported and contained by an indicia-reading module housing. The indicia-reading subassembly also includes a heat-dissipation structure for removing heat from the sensor subassembly, the illuminator-aimer subassembly, and/or the processing subassembly.

In an exemplary embodiment, the heat-dissipation structure is configured to remove heat from the sensor subassembly. In this regard, a thermal path is configured from the sensor IC to the heat-dissipation structure. The heat-dissipation structure in this embodiment includes a thermally conductive heat sink affixed to the sensor subassembly.

In another exemplary embodiment, the heat-dissipation structure is configured to remove heat from the sensor subassembly. In this regard, a thermal path is configured from the sensor IC to the heat-dissipation structure. The heat-dissipation structure in this embodiment includes a thermally conductive indicia-reading housing that is thermally connected to the sensor subassembly In another exemplary embodiment, the heat-dissipation structure is configured to remove heat from the illuminator-aimer subassembly. In this regard, the heat-dissipation structure includes a thermally conductive heat sink affixed to the illuminator light source.

In another exemplary embodiment, the heat-dissipation structure is configured to remove heat from the illuminator-aimer subassembly. In this regard, the heat-dissipation structure includes a thermally conductive indicia-reading housing thermally connected to the illuminator light source.

In another exemplary embodiment, the heat-dissipation structure is configured to remove heat from the illuminator-aimer subassembly. In this regard, the heat-dissipation structure includes a thermally conductive heat sink affixed to the aimer light source.

In another exemplary embodiment, the heat-dissipation structure is configured to remove heat from the illuminator-aimer subassembly. In this regard, the heat-dissipation structure includes a thermally conductive indicia-reading housing thermally connected to the aimer light source.

In another exemplary embodiment, the heat-dissipation structure is configured to remove heat from the processing subassembly. In this regard, the heat-dissipation structure includes a thermally conductive heat sink affixed to the processor IC.

In another exemplary embodiment, the heat-dissipation structure is configured to remove heat from the processing subassembly. In this regard, the heat-dissipation structure includes a thermally conductive indicia-reading housing thermally connected to the processor IC.

In yet another exemplary embodiment, the heat-dissipation structure is configured to dissipate heat to the body of a mobile computing device. In this regard, the heat-dissipation structure includes a thermally conductive indicia-housing thermally connected to the body of the mobile computing device by contacting the magnesium frame of the MCD electronic subassembly or directly contacting the MCD aluminum case perimeter frame.

The foregoing illustrative summary, as well as other exemplary objectives and/or advantages of the invention, and the manner in which the same are accomplished, are further explained within the following detailed description and its accompanying drawings.

DETAILED DESCRIPTION

The present invention embraces an indicia reader integrated into the body (e.g., metal support frame or enclosure) of a mobile computing device (e.g., smart phone). These devices are lightweight, pocket-sized devices that are easy to carry and operate with a single hand.

Figure 1:
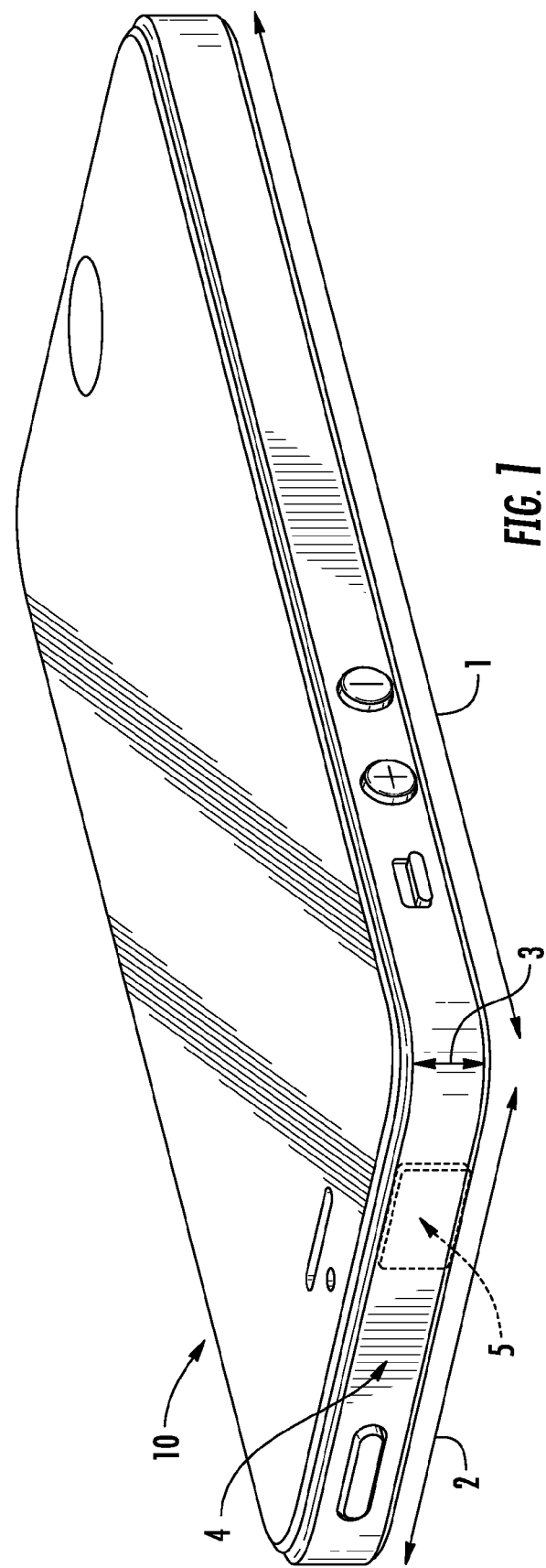
FIG. 1 depicts an exemplary mobile computing device with an integrated indicia-reading module.

A mobile computing device 10, such as shown in FIG. 1, tend to be rectangular cuboids, in which the thickness is substantially smaller than both its height and its width. A smart phone device, for example, can have a length dimension 1, a width dimension 2, and a thickness dimension 3 of roughly 115 millimeters×59 millimeters×9 millimeters. These dimensions may vary, but some general rules apply.

A mobile computing device's length and width are determined by the display size. The thickness 3 plays an important role in the ease of handling. Thinner devices are easier to hold and manipulate. Thinner devices, however, make the integration of application specific modules (e.g., indicia reading modules) challenging.

FIG. 1 depicts an exemplary embodiment of an indicia reading module integrated within a mobile computing device (i.e., smart phone). The window 5 of the indicia-reading module is formed in the narrow edge 4 of the device. This allows for easy imaging and operation. To achieve such an embodiment, however, requires the combination of space-saving and thermal management techniques.

Figure 2:
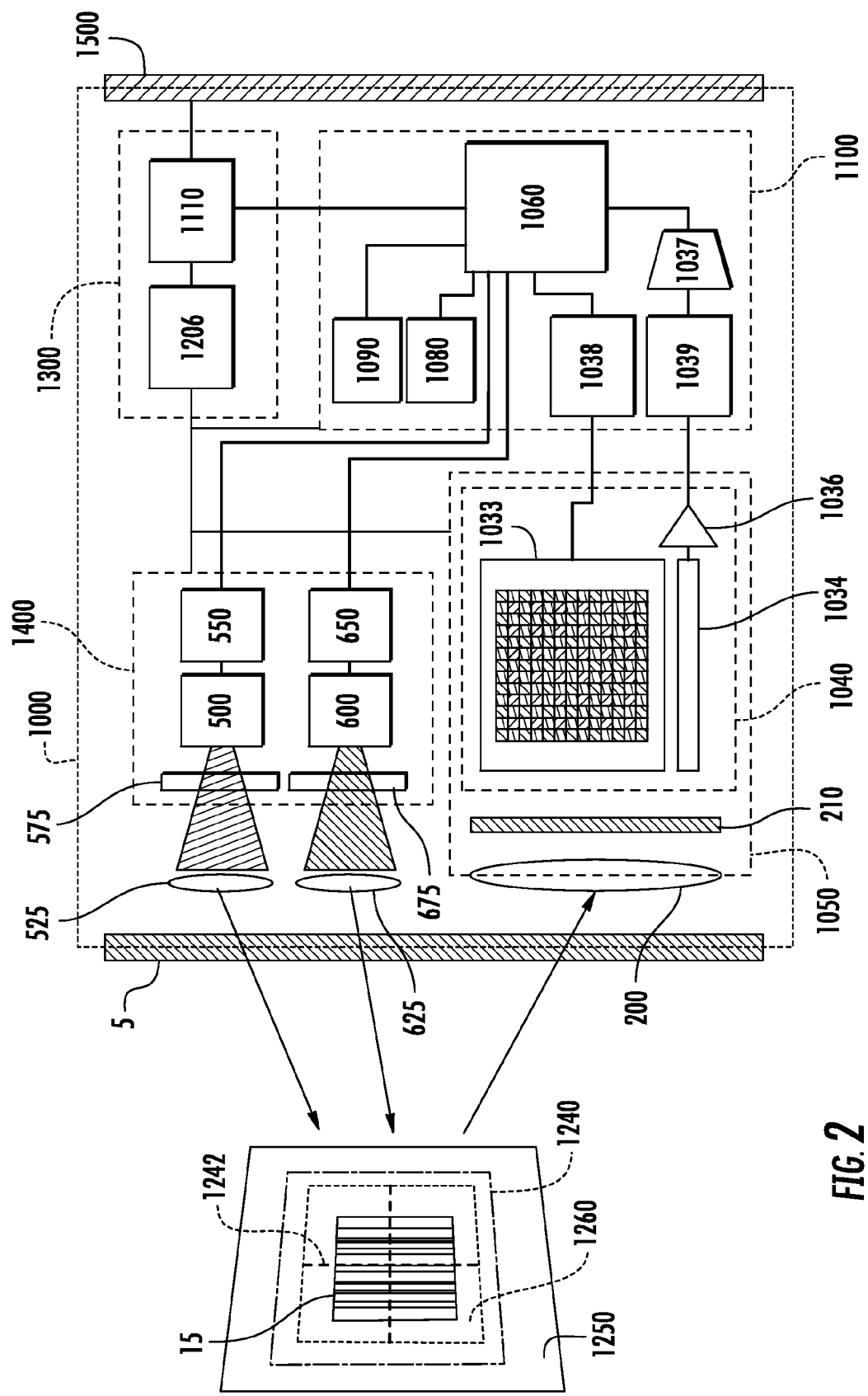
FIG. 2 depicts a block diagram of an exemplary indicia-reading module.

FIG. 2 shows a block diagram of an indicia-reading module 1000. The indicia-reading module shown includes a sensor subassembly 1050 with an adjustable lens 200. The adjustable lens 200 images the indicia-reading module's field of view 1240 onto a sensor integrated circuit (IC) 1040. The front surface of the sensor IC 1040 contains an active area 1033 with a plurality of pixels. The pixels are arranged in rows and columns and are sensitive to light. The sensor IC 1040 may implement CMOS or CCD imaging technology to convert the light from a target 1250 into a digital image.

In order to image indicia (i.e., barcodes), an image of the module's field of view 1240 is focused by the adjustable lens 200 onto the sensor IC's 1040 plurality of pixels 1033. The pixels are exposed to the imaged light via a physical or electronic shutter. During the exposure, a charge is created in each pixel. The charge depends on the image intensity in that region of the field of view. After the exposure is complete, the charges from the pixels are shifted row by row into a shift register 1034 where they then shifted out one by one and are amplified via an amplifier 1036. The exposure, readout, timing, and other operational settings are controlled by the image sensor timing and control circuit 1038. The amplified analog signal is rendered suitable for digital conversion by a processing circuit 1039 and then converted into a digital signal via an analog-to-digital (A/D) converter 1037. The digital image is reconstructed and reformatted by the processor integrated circuit (i.e., CPU) 1060.

Figure 3:
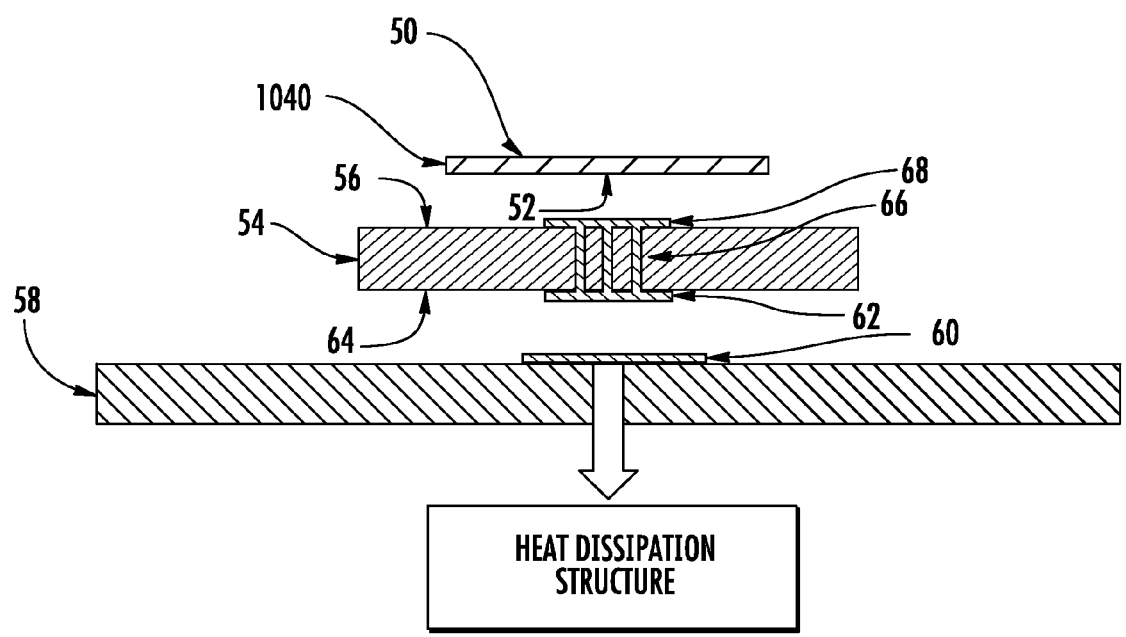
FIG. 3 depicts an exploded view of an exemplary sensor subassembly, highlighting the heat dissipation.

As shown in FIG. 3, the sensor IC 1040 has a front surface 50 with a plurality of pixels. The back surface 52 of the sensor IC is for mounting. The sensor IC is mounted to a substrate 54 using thermally conductive epoxy so that the back surface 52 of the sensor IC is contiguous to the substrate's top surface 56. The substrate with the epoxied sensor IC is affixed to a sensor printed circuit board (PCB) 58. The sensor PCB 58 provides electrical connectivity, support, and helps establish a thermal path for dissipating heat from the sensor IC.

Thermal management for the sensor IC is important for good imaging. Sensor noise increases with temperature. It is therefore important to dissipate the heat generated by this component. A heat-dissipation structure is established through the connection of the sensor IC to a large thermal mass via a thermally conducting path.

In one embodiment, a thermally conductive heat sink is attached via metallic traces or vias to a metallic circuit pad 60 on the sensor PCB 58. The substrate 54 is affixed to the sensor PCB, typically by soldering, so that a metallic bottom pad 62 on the bottom surface 64 of the substrate is in contact with the metallic circuit pad 60 on the sensor PCB. An array of metallic vias 66, running through the substrate, connect the metallic bottom pad 62 to a metallic top pad 68 on the top surface 56 of the substrate. The sensor IC's back surface 52 is connected via thermally conductive epoxy to the top metallic pad. As a result, the heat generated by the sensor IC 1040 flows to the substrate's metallic top pad 66. The metallic top pad 66, being connected to the metallic bottom pad 62 by the array of metallic vias 66 running through the substrate 54, conducts the heat to the PCB's metallic circuit pad 60. The heat then flows from the metallic circuit pad through thermal vias into the heat-dissipation structure, which in this embodiment is a thermally conductive heat sink directly attaching to the other side of the PCB. In this way, the sensor IC temperature is maintained within a suitable range.

In the embodiment described above, the metallic features (e.g., pads, traces, vias) could be copper or any thermally conductive material. The vias could be metal rivets or metal plated holes through the substrate. Also, while a thermally conductive heat sink was described, any heat-dissipating structure with a large thermal mass could be used as well. For example, a thermally conducting indicia-reading module housing or even the body of the mobile computing device (i.e., metal support frame or enclosure) could be thermally connected to the sensor IC in order to dissipate its heat.

The indicia-reading module, as shown in FIG. 2, has the processing and electronics necessary to decode information from indicia images. The processing subassembly 1100 includes the input and output circuitry for the sensor subassembly 1038, 1039, as well as a processor integrated circuit 1060 and RAM memory 1080 and flash memory 1090 for program and configuration data storage. Here, the processor IC 1060 executes algorithms to perform image processing and decoding.

Processor IC's may generate heat that can affect the operation of the indicia-reading module. As a result, a heat-dissipation structure may be required to remove this heat from this subassembly. Here, heat dissipation may be achieved by affixing a thermally conductive heat sink to the processor IC 1060. Alternatively, heat dissipation may be achieved by connecting the processor IC 1060 to a thermally conductive (e.g., metal or thermally conductive plastic) indicia-reading module housing.

As shown in FIG. 2, the indicia-reading module 1000 can have an interface circuit subassembly 1300. This circuit subassembly is built onto its own board and is connected to the bus 1500, other subassemblies, and modules via flex cabling. The interface circuit 1110 on this board serves to assist in the communication of data to and from the indicia-reading module 1000 and to transition power into the module and to the power circuit 1206 where it is conditioned and distributed within the indicia-reading module 1000.

FIG. 2 shows the interface of the module as a bus 1500. The bus 1500 is considered to be any communication system that transfers data (and power) between components inside the computer or, in this case, the smart hand-held device. The bus may be used to communicate data back and forth between the indicia-reading module 1000 and the host device or peripheral. Power may also be delivered over the bus. A power conditioning circuit, a battery, DC power supply, or any other source for providing power can use the bus to deliver power to the indicia-reading module. Finally, diagnostic and programming devices may use the bus to deliver programming information or receive diagnostic information from the indicia-reading module.

As depicted in FIG. 2, the interface circuit subassembly 1300 also includes a power unit 1206 that protects against overloads and distributes power at the right level and at the right time to the various subassemblies and modules within the indicia-reading module. The power unit 1206 can include a charging circuit that is continually charged by a power supply and can be configured to output energy within a range of power levels to accommodate various operation characteristics. The power from this unit can be provided as constant current or constant voltage and is adjustable so that it can serve the constant power needs of the module as well as intermittent service to subsystems for such operations as illumination, exposure, focusing, and aiming.

The illuminator-aimer subassembly 1400, shown in FIG. 2, is used to help the user align the indicia 15 within the module's field of view 1240 and to provide light for the sensor subassembly to record with good fidelity. This circuit subassembly is built onto its own board and is connected to other subassemblies and modules via flex cabling.

As shown in FIG. 2, the illuminator-aimer subassembly 1400 has two subsystems that perform similar actions. In general, it can be said that both are projection systems and, as such, can use a variety of optical technologies and methods (e.g., lenses, lightpipes, or diffractive optics) to achieve the objective of illuminating the scene and providing an aiming image. The illuminator driver circuit 550 and the aimer driver circuit 650 provide power (e.g., a constant current) to the illuminator light source 500 and aimer light source 600, respectively. The illuminator light source 500 and the aimer light source 600 may include an LED or bank of LEDs. Alternatively, the aimer light source can be a laser diode to provide highly visible pattern in extra long range and under direct sun light. The illumination light source should provide light of sufficient intensity to allow for the sensor subassembly 1050 to capture an image of low noise and high dynamic range image with no saturation. The light should be uniform across the field of view for best results and at a wavelength that the sensor IC 1040 was designed for (e.g., visible wavelength regime). Upon triggering the illuminator, driver circuit 550 causes the illuminator light source 500 to emit light. The light passes through a rectangular illuminator aperture 575. The image of this illuminator aperture 575 is formed on the target 1250 via the illuminator lens 525. Thus, in this embodiment, a rectangular image 1260 of uniform white light would appear on the target 1250.

To help alignment, the user may also be provided with an aligning pattern 1242. This pattern is formed like the illumination pattern 1260. The light from the aimer light source 600 passes through an aimer aperture 675 (e.g., crosshair, line, or rectangle) and then is imaged via the aimer lens 625 to form an aligning pattern 1242 on the target 1250. When the user aligns the crosshairs with the center of the indicia, the indicia will image onto the center of the sensor IC's active area 1033. In one embodiment, the CPU 1060 can provide control inputs to all control circuits (e.g., the image sensor timing and control circuit 1038, the illuminator driver circuit 550, and the aimer driver circuit 650) and to the power unit 1206 to coordinate timing between image sensor array controls and illumination subsystem controls.

The illuminator-aimer subassembly may generate heat that can affect the operation of the indicia-reading module. As a result, a heat-dissipation structure may be required to remove this heat from the subassembly. The heat dissipation may be achieved by affixing a thermally conductive heat sink to the illuminator light source 500 and/or aimer light source 600. Alternatively, the heat dissipation may be achieved by connecting the illuminator light source 500 and/or aimer light source 600 to a thermally conductive (e.g., metal or thermally conductive plastic) indicia-reading module housing.

The imaging lens assembly 200 can be adapted for focusing an image of a decodable barcode 15, which is located within the field of view 1240, onto image sensor array 1033. Working distances should not vary so greatly that they cannot be accommodated by the depth of field and the size of the sensor. In this embodiment, the imaging lens has relatively a high f-number (i.e., f/#) and thus a long depth of field to accommodate all normal usage scenarios, thereby precluding the need for active focusing. Active focusing could be used but would typically add complexity, size, and cost.

As depicted in FIG. 1, the window 5 of the indicia-reading module is integrated into a narrow edge of the smart device 4. This serves to seal the smart device and the sensor subassembly to protect it from dust and debris. It also can perform some optical filtering in order to reduce the unwanted stray light that otherwise would enter the device (e.g., possibly affecting performance).

Figure 4:
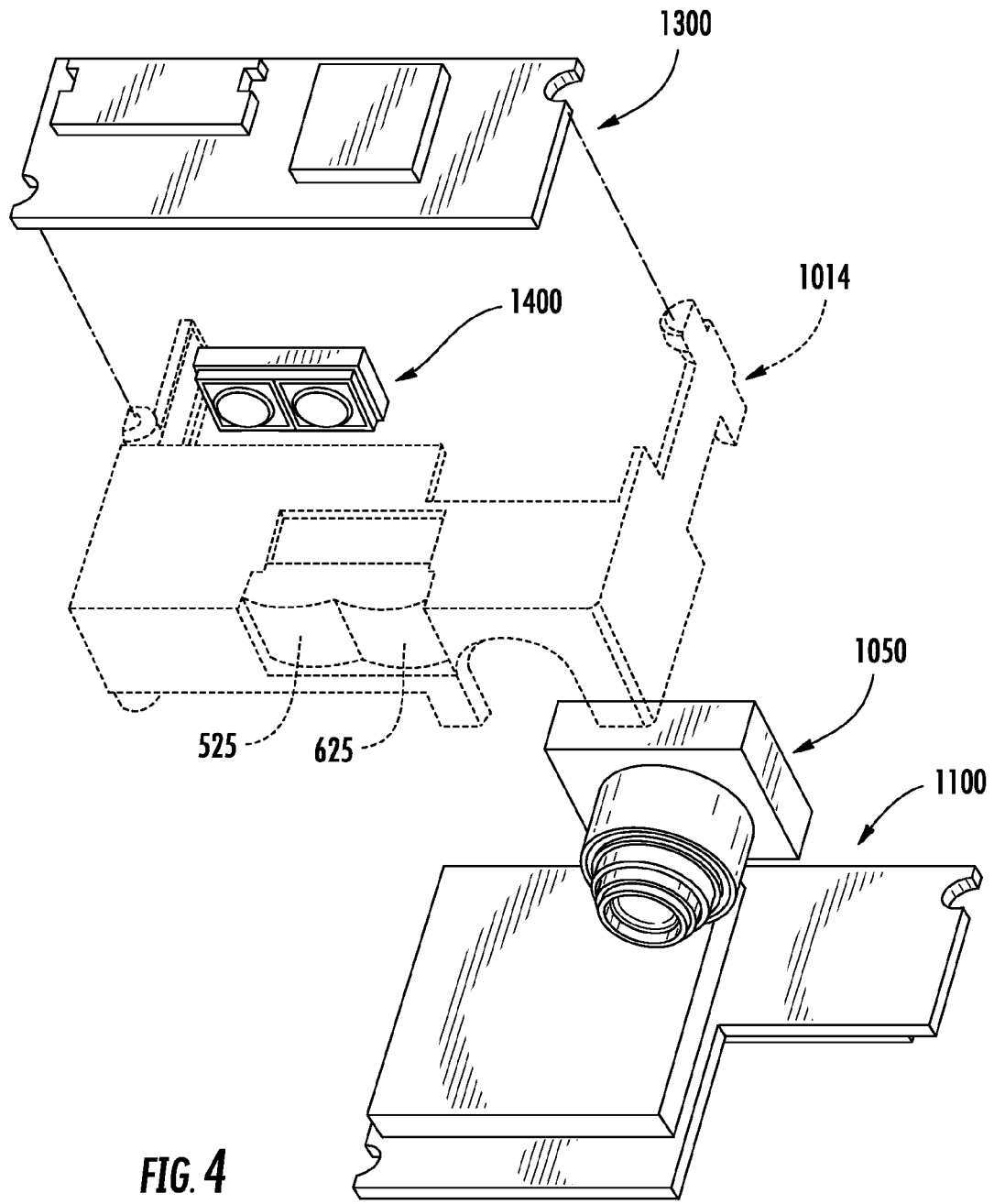
FIG. 4 depicts an exploded view of an exemplary indicia-reading module.

As shown in FIG. 4, the indicia-reading module typically includes a (i) a sensor subassembly 1050, (ii) an illuminator-aimer subassembly 1400, (iii) a processing subassembly 1100, and (iv) an interface circuit subassembly 1300. Each of these subassemblies can be constructed on a discrete circuit board, and each are connected using flex or rigid-flex cabling. Rigid-flex circuit technology connects all of the subassemblies with metal traces and reduces heat transfer resistance. The traces and copper planes in the circuitry serve as heat conducting paths between subassemblies and form a large heat dissipation mass. This heat dissipation mass is contiguous to an indicia-reading module housing 1014 and possibly the MCD body for efficient heat transfer. The subassemblies are supported and contained by the indicia-reading module housing 1014. This housing may be used as part of the heat-dissipation structure if it is constructed using materials such as metal or thermally conductive plastic.

Figure 5:
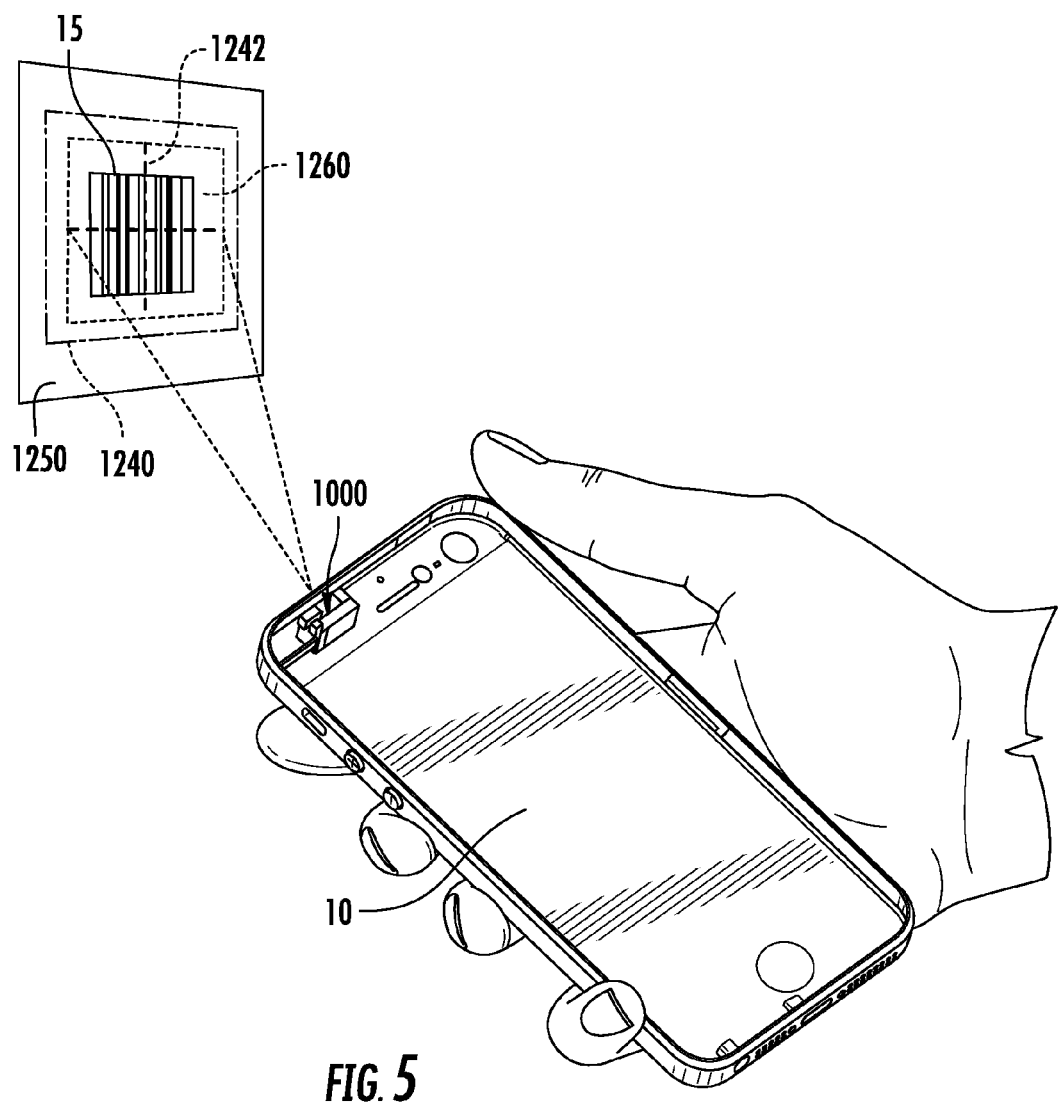
FIG. 5 depicts the operation of an exemplary integrated indicia-reading module in a mobile computing device.

FIG. 5 illustrates the relative size of the indicia-reading module with respect to the smart device 10. As depicted in FIG. 5, the indicia-reading module 1000 can be oriented by a user with respect to a target (e.g., a package label) bearing decodable indicia 15 so that an illumination pattern 1260 is projected onto decodable indicia 15. In the exemplary embodiment depicted in FIG. 5, a code symbol 15 is provided by a 1D bar code symbol, although a code symbol may also be provided by a 2D bar code symbol or optical character recognition (OCR) characters. The user aligns the aimer pattern 1242 and takes a frame of image data. The frame that can be captured and subject to decoding can be a full frame (including pixel values corresponding to each pixel of image sensor array active area 1033, a partial frame in which a maximum number of pixels read out from image sensor array 1033 during operation of the indicia-reading module 1000), or a windowed frame that includes pixel values corresponding to less than a full frame of pixels of image sensor array 1033. A picture size of a windowed frame can vary depending on the number of pixels subject to addressing and readout for capture of a windowed frame.

To supplement the present disclosure, this application incorporates entirely by reference the following commonly assigned patents, patent application publications, and patent applications:

U.S. Pat. No. 6,832,725; U.S. Pat. No. 7,128,266;
U.S. Pat. No. 7,159,783; U.S. Pat. No. 7,413,127;
U.S. Pat. No. 7,726,575; U.S. Pat. No. 8,294,969;
U.S. Pat. No. 8,317,105; U.S. Pat. No. 8,322,622;
U.S. Pat. No. 8,366,005; U.S. Pat. No. 8,371,507;
U.S. Pat. No. 8,376,233; U.S. Pat. No. 8,381,979;
U.S. Pat. No. 8,390,909; U.S. Pat. No. 8,408,464;
U.S. Pat. No. 8,408,468; U.S. Pat. No. 8,408,469;
U.S. Pat. No. 8,424,768; U.S. Pat. No. 8,448,863;
U.S. Pat. No. 8,457,013; U.S. Pat. No. 8,459,557;
U.S. Pat. No. 8,469,272; U.S. Pat. No. 8,474,712;
U.S. Pat. No. 8,479,992; U.S. Pat. No. 8,490,877;
U.S. Pat. No. 8,517,271; U.S. Pat. No. 8,523,076;
U.S. Pat. No. 8,528,819; U.S. Pat. No. 8,544,737;
U.S. Pat. No. 8,548,242; U.S. Pat. No. 8,548,420;
U.S. Pat. No. 8,550,335; U.S. Pat. No. 8,550,354;
U.S. Pat. No. 8,550,357; U.S. Pat. No. 8,556,174;
U.S. Pat. No. 8,556,176; U.S. Pat. No. 8,556,177;
U.S. Pat. No. 8,559,767; U.S. Pat. No. 8,559,957;
U.S. Pat. No. 8,561,895; U.S. Pat. No. 8,561,903;
U.S. Pat. No. 8,561,905; U.S. Pat. No. 8,565,107;
U.S. Pat. No. 8,571,307; U.S. Pat. No. 8,579,200;
U.S. Pat. No. 8,583,924; U.S. Pat. No. 8,584,945;
U.S. Pat. No. 8,587,595; U.S. Pat. No. 8,587,697;
U.S. Pat. No. 8,588,869; U.S. Pat. No. 8,590,789;
U.S. Pat. No. 8,593,539; U.S. Pat. No. 8,596,542;
U.S. Pat. No. 8,596,543; U.S. Pat. No. 8,599,271;
U.S. Pat. No. 8,599,957; U.S. Pat. No. 8,600,158;
U.S. Pat. No. 8,600,167; U.S. Pat. No. 8,602,309;
U.S. Pat. No. 8,608,053; U.S. Pat. No. 8,608,071;
U.S. Pat. No. 8,611,309; U.S. Pat. No. 8,615,487;
U.S. Pat. No. 8,616,454; U.S. Pat. No. 8,621,123;
U.S. Pat. No. 8,622,303; U.S. Pat. No. 8,628,013;
U.S. Pat. No. 8,628,015; U.S. Pat. No. 8,628,016;
U.S. Pat. No. 8,629,926; U.S. Pat. No. 8,630,491;
U.S. Pat. No. 8,635,309; U.S. Pat. No. 8,636,200;
U.S. Pat. No. 8,636,212; U.S. Pat. No. 8,636,215;
U.S. Pat. No. 8,636,224; U.S. Pat. No. 8,638,806;
U.S. Pat. No. 8,640,958; U.S. Pat. No. 8,640,960;
U.S. Pat. No. 8,643,717; U.S. Pat. No. 8,646,692;
U.S. Pat. No. 8,646,694; U.S. Pat. No. 8,657,200;
U.S. Pat. No. 8,659,397; U.S. Pat. No. 8,668,149;
U.S. Pat. No. 8,678,285; U.S. Pat. No. 8,678,286;
U.S. Pat. No. 8,682,077; U.S. Pat. No. 8,687,282;
International Publication No. 2013/163789;
International Publication No. 2013/173985;
International Publication No. 2014/019130;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2011/0169999;
U.S. Patent Application Publication No. 2011/0202554;
U.S. Patent Application Publication No. 2012/0111946;
U.S. Patent Application Publication No. 2012/0138685;
U.S. Patent Application Publication No. 2012/0168511;
U.S. Patent Application Publication No. 2012/0168512;
U.S. Patent Application Publication No. 2012/0193407;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0056285;
U.S. Patent Application Publication No. 2013/0070322;
U.S. Patent Application Publication No. 2013/0075168;
U.S. Patent Application Publication No. 2013/0082104;
U.S. Patent Application Publication No. 2013/0175341
U.S. Patent Application Publication No. 2013/0175343;
U.S. Patent Application Publication No. 2013/0200158;
U.S. Patent Application Publication No. 2013/0256418;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0278425;
U.S. Patent Application Publication No. 2013/0287258;
U.S. Patent Application Publication No. 2013/0292474;
U.S. Patent Application Publication No. 2013/0292475;
U.S. Patent Application Publication No. 2013/0292477;

U.S. Patent Application Publication No. 2013/0293539;
U.S. Patent Application Publication No. 2013/0293540;
U.S. Patent Application Publication No. 2013/0306728;
U.S. Patent Application Publication No. 2013/0306730;
U.S. Patent Application Publication No. 2013/0306731;
U.S. Patent Application Publication No. 2013/0306734;
U.S. Patent Application Publication No. 2013/0307964;
U.S. Patent Application Publication No. 2013/0313324;
U.S. Patent Application Publication No. 2013/0313325;
U.S. Patent Application Publication No. 2013/0313326;
U.S. Patent Application Publication No. 2013/0327834;
U.S. Patent Application Publication No. 2013/0341399;
U.S. Patent Application Publication No. 2013/0342717;
U.S. Patent Application Publication No. 2014/0001267;
U.S. Patent Application Publication No. 2014/0002828;
U.S. Patent Application Publication No. 2014/0008430;
U.S. Patent Application Publication No. 2014/0008439;
U.S. Patent Application Publication No. 2014/0021256;
U.S. Patent Application Publication No. 2014/0025584;
U.S. Patent Application Publication No. 2014/0027518;
U.S. Patent Application Publication No. 2014/0034723;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061305;
U.S. Patent Application Publication No. 2014/0061306;
U.S. Patent Application Publication No. 2014/0061307;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. patent application Ser. No. 13/367,978 for a Laser Scanning Module Employing An Elastomeric U-Hinge Based Laser Scanning Assembly, filed Feb. 7, 2012 (Feng et al.);
U.S. patent application Ser. No. 13/400,748 for a Laser Scanning Bar Code Symbol Reading System Having Intelligent Scan Sweep Angle Adjustment Capabilities Over The Working Range Of The System For Optimized Bar Code Symbol Reading Performance, filed Feb. 21, 2012 (Wilz);
U.S. patent application Ser. No. 13/736,139 for an Electronic Device Enclosure, filed Jan. 8, 2013 (Chaney);
U.S. patent application Ser. No. 13/750,304 for Measuring Object Dimensions Using Mobile Computer, filed Jan. 25, 2013;
U.S. patent application Ser. No. 13/771,508 for an Optical Redirection Adapter, filed Feb. 20, 2013 (Anderson);
U.S. patent application Ser. No. 13/780,158 for a Distraction Avoidance System, filed Feb. 28, 2013 (Sauerwein);
U.S. patent application Ser. No. 13/780,196 for Android Bound Service Camera Initialization, filed Feb. 28, 2013 (Todeschini et al.);
U.S. patent application Ser. No. 13/780,271 for a Vehicle Computer System with Transparent Display, filed Feb. 28, 2013 (Fitch et al.);
U.S. patent application Ser. No. 13/780,356 for a Mobile Device Having Object-Identification Interface, filed Feb. 28, 2013 (Samek et al.);
U.S. patent application Ser. No. 13/784,933 for an Integrated Dimensioning and Weighing System, filed Mar. 5, 2013 (McCloskey et al.);
U.S. patent application Ser. No. 13/785,177 for a Dimensioning System, filed Mar. 5, 2013 (McCloskey et al.);

U.S. patent application Ser. No. 13/792,322 for a Replaceable Connector, filed Mar. 11, 2013 (Skvoretz);
U.S. patent application Ser. No. 13/852,097 for a System and Method for Capturing and Preserving Vehicle Event Data, filed Mar. 28, 2013 (Barker et al.);
U.S. patent application Ser. No. 13/895,846 for a Method of Programming a Symbol Reading System, filed Apr. 10, 2013 (Corcoran);
U.S. patent application Ser. No. 13/902,110 for a System and Method for Display of Information Using a Vehicle-Mount Computer, filed May 24, 2013 (Hollifield);
U.S. patent application Ser. No. 13/902,144, for a System and Method for Display of Information Using a Vehicle-Mount Computer, filed May 24, 2013 (Chamberlin);
U.S. patent application Ser. No. 13/902,242 for a System For Providing A Continuous Communication Link With A Symbol Reading Device, filed May 24, 2013 (Smith et al.);
U.S. patent application Ser. No. 13/912,262 for a Method of Error Correction for 3D Imaging Device, filed Jun. 7, 2013 (Jovanovski et al.);
U.S. patent application Ser. No. 13/912,702 for a System and Method for Reading Code Symbols at Long Range Using Source Power Control, filed Jun. 7, 2013 (Xian et al.);
U.S. patent application Ser. No. 13/922,339 for a System and Method for Reading Code Symbols Using a Variable Field of View, filed Jun. 20, 2013 (Xian et al.);
U.S. patent application Ser. No. 13/927,398 for a Code Symbol Reading System Having Adaptive Autofocus, filed Jun. 26, 2013 (Todeschini);
U.S. patent application Ser. No. 13/930,913 for a Mobile Device Having an Improved User Interface for Reading Code Symbols, filed Jun. 28, 2013 (Gelay et al.);
U.S. patent application Ser. No. 13/933,415 for an Electronic Device Case, filed Jul. 2, 2013 (London et al.);
U.S. patent application Ser. No. 13/947,296 for a System and Method for Selectively Reading Code Symbols, filed Jul. 22, 2013 (Rueblinger et al.);
U.S. patent application Ser. No. 13/950,544 for a Code Symbol Reading System Having Adjustable Object Detection, filed Jul. 25, 2013 (Jiang);
U.S. patent application Ser. No. 13/961,408 for a Method for Manufacturing Laser Scanners, filed Aug. 7, 2013 (Saber et al.);
U.S. patent application Ser. No. 13/974,374 for Authenticating Parcel Consignees with Indicia Decoding Devices, filed Aug. 23, 2013 (Ye et al.);
U.S. patent application Ser. No. 14/018,729 for a Method for Operating a Laser Scanner, filed Sep. 5, 2013 (Feng et al.);
U.S. patent application Ser. No. 14/019,616 for a Device Having Light Source to Reduce Surface Pathogens, filed Sep. 6, 2013 (Todeschini);
U.S. patent application Ser. No. 14/023,762 for a Handheld Indicia Reader Having Locking Endcap, filed Sep. 11, 2013 (Gannon);
U.S. patent application Ser. No. 14/035,474 for Augmented-Reality Signature Capture, filed Sep. 24, 2013 (Todeschini);
U.S. patent application Ser. No. 14/047,896 for Terminal Having Illumination and Exposure Control filed Oct. 7, 2013 (Jovanovski et al.);
U.S. patent application Ser. No. 14/035,474 for Augmented-Reality Signature Capture, filed Sep. 24, 2013 (Todeschini);
U.S. patent application Ser. No. 14/050,515 for Hybrid-Type Bioptical, filed Oct. 10, 2013 (Edmonds et al.);
U.S. patent application Ser. No. 14/053,175 for Imaging Apparatus Having Imaging Assembly, filed Oct. 14, 2013

(Barber) U.S. patent application Ser. No. 14/055,234 for Dimensioning System, filed Oct. 16, 2013 (Fletcher);

U.S. patent application Ser. No. 14/055,353 for Dimensioning System, filed Oct. 16, 2013 (Giordano et al.);

U.S. patent application Ser. No. 14/055,383 for Dimensioning System, filed Oct. 16, 2013 (Li et al.);

U.S. patent application Ser. No. 14/053,314 for Indicia Reader, filed Oct. 14, 2013 (Huck);

U.S. patent application Ser. No. 14/058,762 for Terminal Including Imaging Assembly, filed Oct. 21, 2013 (Gomez et al.);

U.S. patent application Ser. No. 14/062,239 for Chip on Board Based Highly Integrated Imager, filed Oct. 24, 2013 (Toa et al.);

U.S. patent application Ser. No. 14/065,768 for Hybrid System and Method for Reading Indicia, filed Oct. 29, 2013 (Meier et al.);

U.S. patent application Ser. No. 14/074,746 for Self-Checkout Shopping System, filed Nov. 8, 2013 (Hejl et al.);

U.S. patent application Ser. No. 14/074,787 for Method and System for Configuring Mobile Devices via NFC Technology, filed Nov. 8, 2013 (Smith et al.);

U.S. patent application Ser. No. 14/082,468 for Encoded Information Reading Terminal with Wireless Path Selection Capability, filed Nov. 18, 2013 (Wang et al.);

U.S. patent application Ser. No. 14/087,190 for Optimal Range Indicators for Bar Code Validation, filed Nov. 22, 2013 (Hejl);

U.S. patent application Ser. No. 14/093,484 for System for Capturing a Document in an Image Signal, filed Dec. 1, 2013 (Showering);

U.S. patent application Ser. No. 14/093,487 for Method and System Operative to Process Color Image Data, filed Dec. 1, 2013 (Li et al.);

U.S. patent application Ser. No. 14/093,490 for Imaging Terminal Having Image Sensor and Lens Assembly, filed Dec. 1, 2013 (Havens et al.);

U.S. patent application Ser. No. 14/093,624 for Apparatus Operative for Capture of Image Data, filed Dec. 2, 2013 (Havens et al.);

U.S. patent application Ser. No. 14/094,087 for Method and System for Communicating Information in an Digital Signal, filed Dec. 2, 2013 (Peake et al.);

U.S. patent application Ser. No. 14/101,965 for High Dynamic-Range Indicia Reading System, filed Dec. 10, 2013 (Xian);

U.S. patent application Ser. No. 14/107,048 for Roaming Encoded Information Reading Terminal, filed Dec. 16, 2013 (Wang et al.);

U.S. patent application Ser. No. 14/118,400 for Indicia Decoding Device with Security Lock, filed Nov. 18, 2013 (Liu);

U.S. patent application Ser. No. 14/138,206 for System and Method to Store and Retrieve Indentifier Associated Information, filed Dec. 23, 2013 (Gomez et al.);

U.S. patent application Ser. No. 14/143,399 for Device Management Using Virtual Interfaces, filed Dec. 30, 2013 (Caballero);

U.S. patent application Ser. No. 14/147,992 for Decoding Utilizing Image Data, filed Jan. 6, 2014 (Meier et al.);

U.S. patent application Ser. No. 14/150,393 for Incicia-reader Having Unitary Construction Scanner, filed Jan. 8, 2014 (Colavito et al.);

U.S. patent application Ser. No. 14/153,111 for Indicia Reading Terminal Including Frame Quality Evaluation Processing, filed Jan. 13, 2014 (Wang et al.);

U.S. patent application Ser. No. 14/153,142 for Imaging Apparatus Comprising Image Sensor Array having Shared Global Shutter Circuitry, filed Jan. 13, 2014 (Wang);

U.S. patent application Ser. No. 14/153,182 for System and Method to Manipulate an Image, filed Jan. 13, 2014 (Longacre et al.);

U.S. patent application Ser. No. 14/153,213 for Apparatus Comprising Image Sensor Array and Illumination Control, filed Jan. 13, 2014 (Ding);

U.S. patent application Ser. No. 14/153,249 for Terminal Operative for Storing Frame of Image Data, filed Jan. 13, 2014 (Winegar);

U.S. patent application Ser. No. 14/154,207 for Laser Barcode Scanner, filed Jan. 14, 2014 (Hou et al.);

U.S. patent application Ser. No. 14/154,915 for Laser Scanning Module Employing a Laser Scanning Assembly having Elastomeric Wheel Hinges, filed Jan. 14, 2014 (Havens et al.);

U.S. patent application Ser. No. 14/158,126 for Methods and Apparatus to Change a Feature Set on Data Collection Devices, filed Jan. 17, 2014 (Berthiaume et al.);

U.S. patent application Ser. No. 14/159,074 for Wireless Mesh Point Portable Data Terminal, filed Jan. 20, 2014 (Wang et al.);

U.S. patent application Ser. No. 14/159,509 for MMS Text Messaging for Hand Held Indicia Reader, filed Jan. 21, 2014 (Kearney);

U.S. patent application Ser. No. 14/159,603 for Decodable Indicia Reading Terminal with Optical Filter, filed Jan. 21, 2014 (Ding et al.);

U.S. patent application Ser. No. 14/160,645 for Decodable Indicia Reading Terminal with Indicia Analysis Functionality, filed Jan. 22, 2014 (Nahill et al.);

U.S. patent application Ser. No. 14/161,875 for System and Method to Automatically Discriminate Between Different Data Types, filed Jan. 23, 2014 (Wang);

U.S. patent application Ser. No. 14/165,980 for System and Method for Measuring Irregular Objects with a Single Camera filed Jan. 28, 2014 (Li et al.);

U.S. patent application Ser. No. 14/166,103 for Indicia Reading Terminal Including Optical Filter filed Jan. 28, 2014 (Lu et al.);

U.S. patent application Ser. No. 14/176,417 for Devices and Methods Employing Dual Target Auto Exposure filed Feb. 10, 2014 (Meier et al.);

U.S. patent application Ser. No. 14/187,485 for Indicia Reading Terminal with Color Frame Processing filed Feb. 24, 2014 (Ren et al.);

U.S. patent application Ser. No. 14/200,405 for Indicia Reader for Size-Limited Applications filed Mar. 7, 2014 (Feng et al.);

U.S. patent application Ser. No. 14/342,544 for Imaging Based Barcode Scanner Engine with Multiple Elements Supported on a Common Printed Circuit Board filed Mar. 4, 2014 (Liu et al.);

U.S. patent application Ser. No. 14/342,551 for Terminal Having Image Data Format Conversion filed Mar. 4, 2014 (Lui et al.); and U.S. patent application Ser. No. 14/345,735 for Optical Indicia Reading Terminal with Combined Illumination filed Mar. 19, 2014 (Ouyang).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale.

Unless otherwise noted, specific terms have been used in a generic and descriptive sense and not for purposes of limitation.

The invention claimed is:

1. An indicia-reading module configured to integrate within a mobile computing device's body, comprising:
   a sensor subassembly including an adjustable lens for imaging the indicia-reading module's field of view onto a sensor integrated circuit (IC) with a plurality of pixels for detecting an image;
   an illuminator-aimer subassembly for (i) projecting light onto a target within the indicia-reading module's field of view and (ii) projecting a visible aligning pattern onto the target, the visible aligning pattern corresponding with the indicia-reading module's field of view;
   a processing subassembly for executing image-processing algorithms;
   an interface subassembly for facilitating communication between the indicia-reading module and a host device; and
   a thermally-conductive, unitary indicia-reading module housing that supports and contains the sensor subassembly, the illuminator-aimer subassembly, the processing subassembly, and the interface subassembly, wherein the indicia-reading module housing is thermally connected to (i) the sensor subassembly, the illuminator-aimer subassembly, the processing subassembly, and/or the interface subassembly and (ii) the mobile computing device's body.

2. The indicia-reading module according to claim 1, wherein the sensor subassembly comprises:
   a sensor printed circuit board (PCB) with a first surface to which a metallic circuit pad is affixed;
   a substrate having (i) a top surface to which a metallic top pad is affixed, (ii) a bottom surface to which a metallic bottom pad is affixed, and (iii) an array of metallic vias thermally connecting the metallic top pad and the metallic bottom pad; and
   a sensor integrated circuit (IC) having (i) a front surface with the plurality of pixels and (ii) a back surface opposite the front surface;
   wherein the substrate is (i) affixed to the sensor PCB's first surface so that the substrate's metallic bottom pad is in thermal contact with the sensor PCB's metallic circuit pad; and (ii) attached via thermally conductive epoxy to the sensor IC's back surface so that the substrate's metallic top pad is in thermal contact with the sensor IC's back surface.

3. The indicia-reading module according to claim 2, wherein:
   the metallic circuit pad is thermally connected to the indicia-reading module housing.

4. The indicia-reading module according to claim 1, wherein the illuminator-aimer subassembly comprises:
   an illuminator light source;
   an illuminator aperture for limiting the spatial extent of the illuminator light source, the illuminator aperture positioned in front of the illuminator light source; and
   an illuminator lens for projecting light from the illuminator light source onto a target within the indicia-reading module's field of view, the illuminator lens positioned in front of the illuminator aperture.

5. The indicia-reading module according to claim 1, wherein the illuminator-aimer subassembly comprises:
   an aimer light source;
   an aimer aperture for creating the visible aligning pattern corresponding the indicia-reading module's field of view, the aimer aperture positioned in front of the aimer light source; and
   an aimer lens for projecting light from the aimer light source onto a target within the indicia-reading module's field of view, the aimer lens positioned in front of the aimer aperture.

6. The indicia-reading module according to claim 1, wherein the processing subassembly comprises a processor integrated circuit (IC) for executing image processing algorithms.

7. A mobile computing device having indicia-reading capability, comprising:
   an indicia-reading module physically integrated within a body of the mobile computing device in such a way as to facilitate the indicia-reading module's imaging of indicia;
   wherein the indicia-reading module comprises (i) a sensor subassembly including an adjustable lens for imaging the indicia-reading module's field of view onto a sensor integrated circuit (IC) with a plurality of pixels for detecting an image, (ii) an illuminator-aimer subassembly for projecting light onto a target within the indicia-reading module's field of view and for projecting a visible aligning pattern that corresponds with the indicia-reading module's field of view onto the target, (iii) a processing subassembly with processor integrated circuit (IC) for executing image processing algorithms, (iv) an interface subassembly for facilitating communication between the indicia-reading module and a host device, and (v) an indicia-reading module housing to support and contain the subassemblies;
   wherein the sensor subassembly comprises (i) a sensor printed circuit board (PCB) with a first surface to which a metallic circuit pad is affixed, (ii) a substrate having a top surface to which a metallic top pad is affixed, a bottom surface to which a metallic bottom pad is affixed, and an array of metallic vias thermally connecting the metallic top pad and the metallic bottom pad, and (iii) a sensor integrated circuit (IC) having a front surface with the plurality of pixels and a back surface opposite the front surface, the substrate being affixed to the sensor PCB's first surface so that the substrate's metallic bottom pad is in thermal contact with the sensor PCB's metallic circuit pad and is attached via thermally conductive epoxy to the sensor IC's back surface so that the substrate's metallic top pad is in thermal contact with the sensor IC's back surface;
   wherein the illuminator-aimer subassembly comprises (i) an illuminator light source, (ii) an illuminator aperture for limiting the spatial extent of the illuminator light source, the illuminator aperture positioned in front of the illuminator light source, and (iii) an illuminator lens for projecting light from the illuminator light source onto the target within the indicia-reading module's field of view, the illuminator lens positioned in front of the illuminator aperture;
   wherein the illuminator-aimer subassembly further comprises (i) an aimer light source, (ii) an aimer aperture for creating the visible aligning pattern corresponding the indicia-reading module's field of view, the aimer aperture positioned in front of the aimer light source, and (iii) an aimer lens for projecting light from the aimer light source onto the target within the indicia-reading module's field of view, the aimer lens positioned in front of the aimer aperture; and wherein the indicia-reading module comprises a thermally-conductive, unitary indicia-reading module housing thermally connected to (i) the sensor subassembly, the illuminator-aimer subassembly, and/or the processing subassembly and (ii) the body of the mobile computing device.

8. The indicia-reading module according to claim 7, wherein:

the metallic circuit pad is thermally connected to the indicia-reading module housing.

* * * * *